United States Patent
Massimo

(10) Patent No.: US 8,409,488 B2
(45) Date of Patent: Apr. 2, 2013

(54) NANO IMPRESSION LITHOGRAPHIC PROCESS WHICH INVOLVES THE USE OF A DIE HAVING A REGION ABLE TO GENERATE HEAT

(75) Inventor: Tormen Massimo, Trieste (IT)

(73) Assignee: Consiglio Nazionale Delle Ricerche-INFM Istituto Nazion, Genoa (IT)

( * ) Notice: Subject to any disclaimer, the term of this patent is extended or adjusted under 35 U.S.C. 154(b) by 1523 days.

(21) Appl. No.: 10/562,014

(22) PCT Filed: Jun. 22, 2004

(86) PCT No.: PCT/IB2004/002120
§ 371 (c)(1),
(2), (4) Date: Mar. 14, 2006

(87) PCT Pub. No.: WO2004/114017
PCT Pub. Date: Dec. 29, 2004

(65) Prior Publication Data
US 2007/0063390 A1    Mar. 22, 2007

(30) Foreign Application Priority Data
Jun. 23, 2003  (IT) .............................. TO2003A0473

(51) Int. Cl.
*B29C 55/00* (2006.01)
(52) U.S. Cl. ...................................................... 264/479
(58) Field of Classification Search ............. 216/44; 264/479, 219; 156/643
See application file for complete search history.

(56) References Cited

U.S. PATENT DOCUMENTS

| | | | |
|---|---|---|---|
| 1,864,666 A | 6/1932 | Osborne | |
| 2,210,583 A | 8/1940 | Henry | |
| 3,387,333 A | 6/1968 | Irvine et al. | |
| 4,855,197 A * | 8/1989 | Zapka et al. | 430/5 |
| 5,064,597 A * | 11/1991 | Kim | 264/219 |
| 5,259,926 A | 11/1993 | Kuwabara et al. | |
| 5,261,806 A | 11/1993 | Pleasant | |
| 5,772,905 A * | 6/1998 | Chou | 216/44 |
| 6,517,995 B1 | 2/2003 | Jacobson | |

FOREIGN PATENT DOCUMENTS

| | | |
|---|---|---|
| EP | 1 413 923 | 4/2004 |
| WO | WO 2004/058479 A | 7/2004 |

* cited by examiner

*Primary Examiner* — Larry Thrower
(74) *Attorney, Agent, or Firm* — Sughrue Mion, PLLC

(57) ABSTRACT

A lithographic process for forming a pattern in relief (20) on a mass (10) of polymeric material comprises the steps of: preparing the mass (10) of polymeric material and a die (12) having a surface region (14) facing towards the mass (10) of polymeric material and which reproduces in negative the pattern in relief (20); heating the die (12) and putting the mass (10) of polymeric material into contact with the die (12) in any temporal sequence, in such a way that the part of the mass (10) of polymeric material in contact with the surface zone (14) is subject to softening; and separating the die (12) from the mass (10) of polymeric material on the surface of which the pattern in relief (20) has been formed. The heating of at least one part of the die (12) is obtained by generation of thermal energy upon dissipation of another form of energy in at least one region (16) of the die (12).

33 Claims, 6 Drawing Sheets

NANO IMPRESSION LITHOGRAPHIC PROCESS WHICH INVOLVES THE USE OF A DIE HAVING A REGION ABLE TO GENERATE HEAT

This is a National Stage entry of International Application PCT/IB2004/002120, with an international filing date of Jun. 22, 2004, which was published WO2004/114017, and the complete disclosure of which is incorporated into this application by reference.

BACKGROUND OF THE INVENTION

The present invention relates to a lithographic process for the production of structures for use in micro-devices and nano-devices, in particular in the fields of micro-electronics, nano-electronics, micro-fluidics, optics, opto-electronics, magnetic memories, micro-mechanics, nano-mechanics and sensors.

One of the reasons for the rapid and continuous progress which has been possible in the field of micro-electronics during the last three decades is the reduction in the dimensions of devices and their massive integration into single chips. This reduction in scale of the dimension of devices seems also to be influencing other fields such as optics, mechanics and memorisation of data with the same degree of intensity and has given rise to new fields of technology such as micro-fluidics, micro-mechanics and nano-mechanics.

The fabrication of such a variety of devices has posed challenges in terms of productive capacity, resolution, accuracy, flexibility, reliability and cost, and has given an impulse to research into new lithographic techniques.

In this context one emerging technology is represented by nano-impression lithography ("Nano Imprint Lithography" or "NIL") the invention of which has opened a new route in the field of lithography which makes it possible to make less use of rays of energetic particles such as photons, electrons or ions, for the purpose of printing a certain pattern in relief on a thin polymeric film.

The general principle on which NIL is based is that of replicating a pattern in relief present on the surface of a die by pressing this latter onto a film of material which can be deformed under pressure deposited on a substrate. Thus, this material tends to fill the cavities of the die and to conform to its profile. The die is then removed leaving its profile impressed into the polymeric film which is then further treated in a manner well-known to those skilled in the art by means of attack with reactive ions, ion implantation or "lift-off metal". The conventional procedures of NIL have a resolution up to 10 nm with low equipment costs as well as the potential to be used in the above-mentioned technical sectors, including micro-electronics.

The conventional procedures of NIL involve bringing a die having a profile in micro-structured or nano-structured relief on one of its surfaces into contact with a substrate covered in a thin film of a thermoplastic material, introducing the assembly of die and covered substrate between the plates of a press, heating these latter and holding the assembly pressed together for a sufficient time for the pattern formed on the surface of the die to be imprinted onto the thermoplastic film. The role of temperature is to soften the thermoplastic material so as to permit it to flow and to reproduce the profile of the die. In general, the thermoplastic material becomes fluid above a temperature known as the glass transition temperature. Above this temperature the viscosity of the thermoplastic material decreases with an increase in temperature. In conventional NIL procedures, after pressing the die against the substrate covered in polymeric material the temperature of the heated plates of the press must be again reduced below the glass transition temperature of the thermoplastic material before releasing the pressure exerted by the plates, in such a way that the pattern in relief impressed onto the polymeric film maintains its form.

Typically, the thermal excursion of one impression cycle is of the order of 100° C. or more so as to guarantee a sufficient variation in the viscosity of the polymeric material. However, the performance of such a prior art cycle involves a series of disadvantages.

In the first place, the die and the substrate covered with polymeric film are subject to a large thermal expansion which makes their accurate positioning problematic.

This makes it difficult to develop processes which necessitate several lithographic stages involving alignment of micro and nano structures with pre-existing structures.

In the second place, the large thermal capacity of the masses involved in the heating/cooling cycle essentially determines the duration of the process, which typically is of the order of several minutes. This time is very much longer than that which is effectively required at standard pressures for the impression of patterns in relief onto thermoplastic film, which is of the order of a few seconds or less.

In the third place, at each thermal cycle the thermal energy stored in the entire system is wasted, with an increase in the energy consumption of the procedure, which becomes more serious the greater the production volumes.

In the fourth place, it is not possible to repeat the printing procedure in different regions of the substrate covered in thermoplastic material in that this latter would melt completely over the area of the substrate each time, causing the disappearance of the previously impressed patterns.

In the fifth place, it is not possible with the known NIL technology to form a pattern in relief on the surface of three dimensional thermoplastic objects in that this would cause a softening of the material throughout the volume of the object with a loss of its overall shape.

SUMMARY OF THE INVENTION

For the purpose of overcoming the above-indicated disadvantages, the subject of the present invention constitutes a lithographic process having the characteristics set out in the main claims which follow. Preferred characteristics of the process of the invention are set out in the dependent claims.

The process of the invention has the advantage that the heating and cooling times are relatively short because these thermal phenomena involve only one region of the die and the polymeric material in contact with it, so that the overall dimensions of these latter are not subject to significant expansion/contraction and remain substantially unvaried during the entirety of the process.

It is to be noted, moreover, that the heating and subsequent cooling times of the process of the invention are of the order of less than one second, which represents a reduction of about two orders of magnitude with respect to conventional processes, for the performance of which several minutes are required.

The process of the invention also has the advantage over conventional processes of a significant energy saving—of the order of three orders of magnitude—which is more significant with an increase in the scale of production.

Further, the process of the invention can be iterated in several successive phases on separate areas of the same covered substrate, which is, on the other hand, impossible in the conventional processes.

A further advantage of the process of the invention lies in allowing the formation of a pattern in relief on three-dimensional objects, which are heated only superficially in the region in contact with the die.

BRIEF DESCRIPTION OF THE DRAWINGS

Further advantages and characteristics of the present invention will be evident from the following detailed description, provided purely by way of non-limitative example with reference to the attached drawings, in which.

DETAIL DESCRIPTION OF THE INVENTION

Figure 1A:
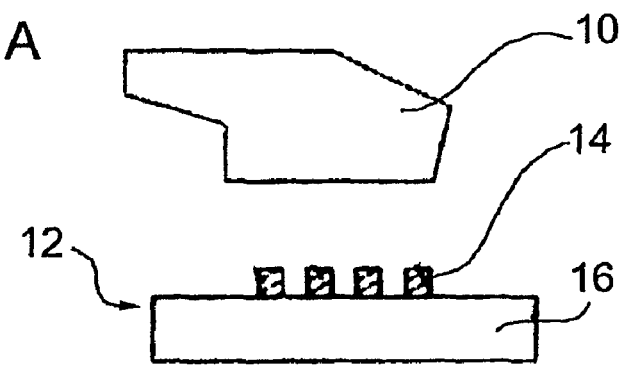
FIGS. 1A to 1D schematically represent successive phases of a first embodiment of the process of the invention.

A nano-impression lithographic process to form a pattern in relief on a mass of polymeric material 10 having any desired three dimensional form (FIG. 1A) to prepare a die 12 having a surface region 14 facing towards the body of polymeric material 10 and which reproduces in negative the pattern in relief to be impressed into the material 10.

The body of the die 12 is of an electrically conductive material 16 preferably having a resistivity of less than 1 $\Omega$*m and more preferably less than 0.0001 $\Omega$*m. For example it can be a semi-conductor, preferably Si or SiC, or a metal, preferably chosen from the group consisting of Ti, Ni, Cr, Cu, Ag, Au, W, Ir, Ta, Pd, Mo, V and their alloys.

Figure 1B:
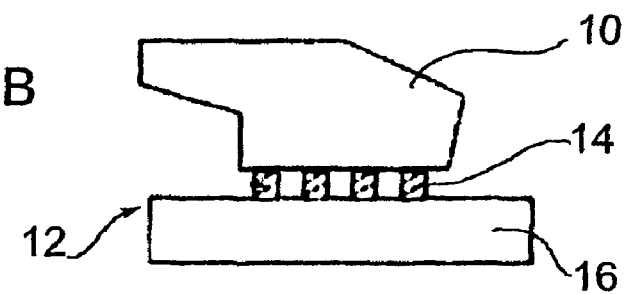
Figure 1C:
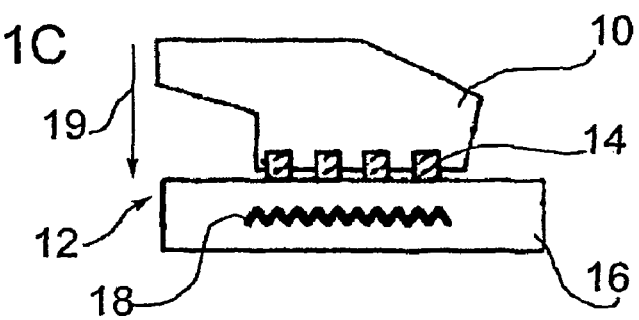

The polymeric material 10 can be of thermoplastic type and is for example chosen from the group consisting of polycarbonates, polymethylmethacrylates, polyethyl methacrylates, polyethylene terephthalates, polyolefins and their mixtures. The mass of polymeric material 10 is then (FIG. 1B) brought into contact with and pressed against the die 12. The contact under pressure can be obtained in a conventional manner by mechanical action, or by electrostatic, magnetic or electro-magnetic force and/or with acoustic shock waves. Contemporaneously with the contact phase an electric current 16 is caused to pass (FIG. 1C) through the body of the die 12 where, by the Joule effect, it thus generates heat which is transmitted by conduction to the surface region 14. The passage of the current 18 may for example be caused by the application of a potential difference or exposure to a variable electro-magnetic or magnetic field. Preferably, the direction of the main flow of electric current 18 is perpendicular to the direction 19 of movement of the mass of polymeric material 10 with respect to the die 12.

Figure 1D:
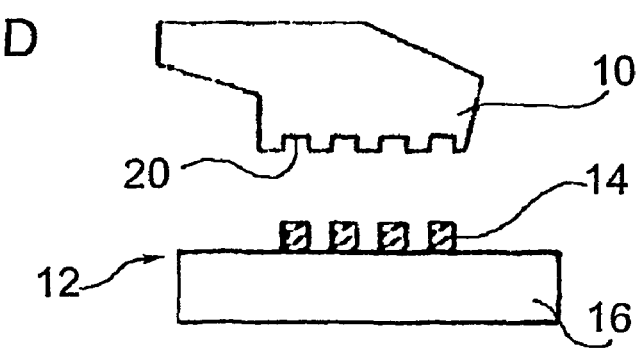
Figure 2A:
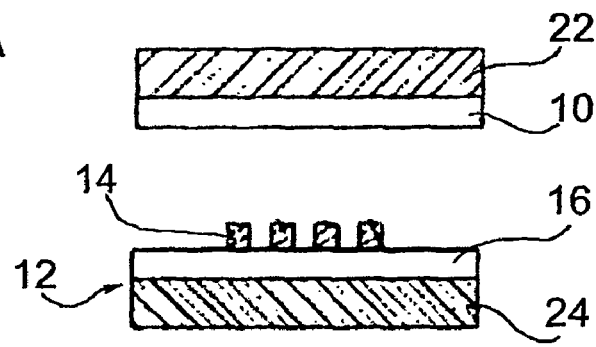
FIGS. 2A to 2D schematically represent successive phases of a second embodiment of the process of the invention.
Figure 2B:
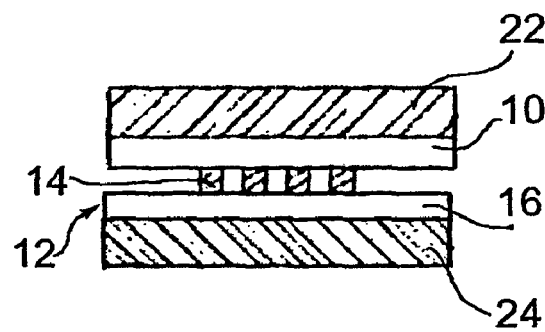
Figure 2C:
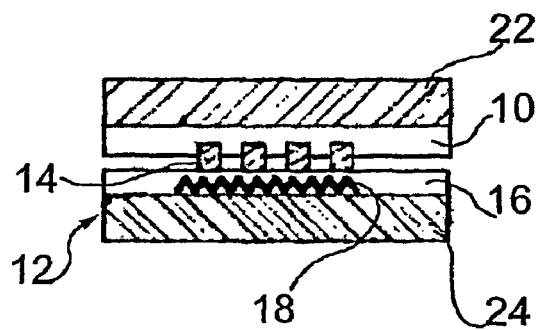
Figure 2D:
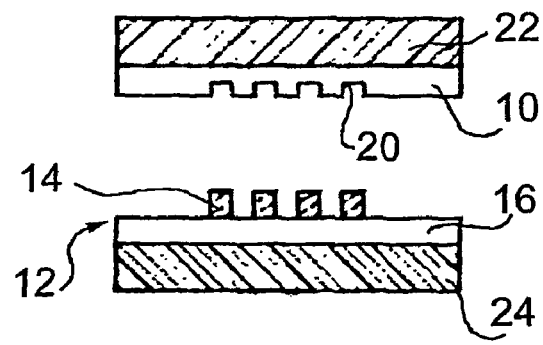
Figure 3A:
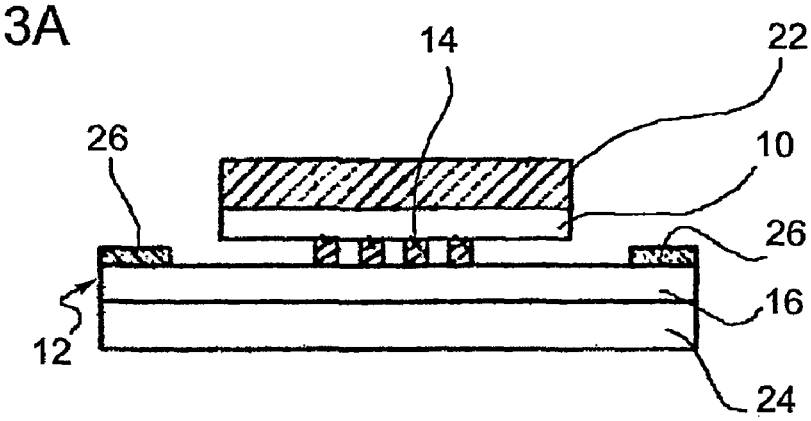
FIGS. 3A to 3C schematically represent successive phases of a third embodiment of the process of the invention.
Figure 3B:
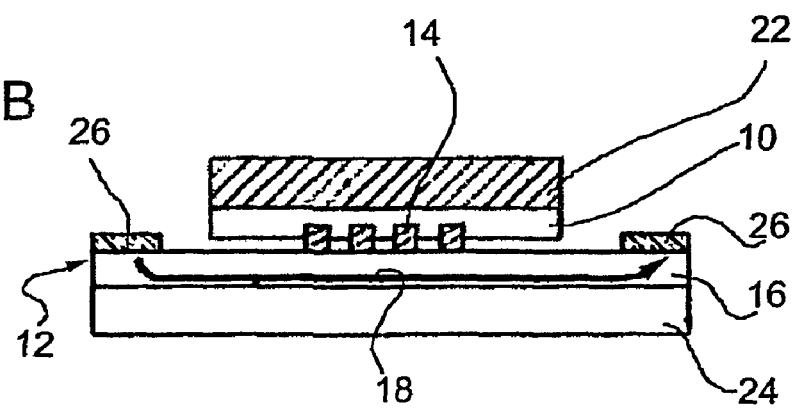
Figure 3C:
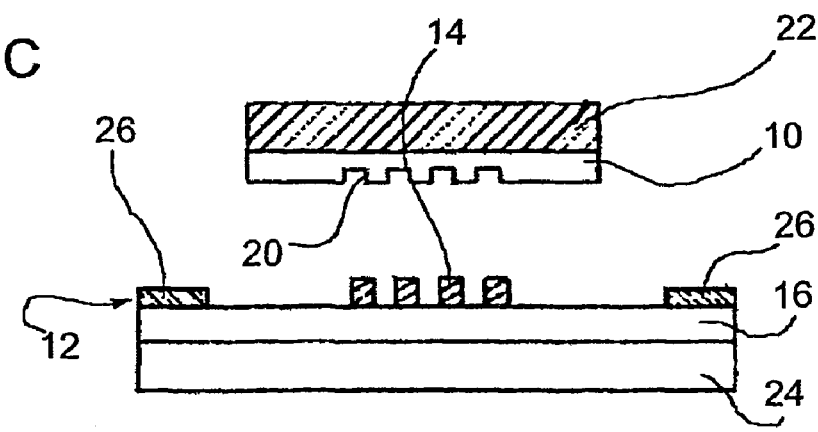

The duration of the heating phase—intended as that in which the polymeric material 10 is brought to a temperature greater than its glass transition temperature at which it behave as a viscous liquid and is subject to softening—is typically less than 25 seconds, preferably less than 50 milliseconds. In this phase the pattern on the zone 14 of the die is impressed into the polymeric material 10. Then this latter is left to cool by diffusion and it is separated (FIG. 1D) from the die 12, leaving exposed the pattern in relief 20 thus obtained. This separation is encouraged if at least a portion of the surface of the die 12 has been preliminarily coated with a release agent.

Figures from 2A to 2D illustrate the various phases of an alternative embodiment of the process of the invention, in which the same reference numerals as those previously utilised again distinguish the same or equivalent parts.

In this case, the mass of polymeric material 10 has a two-dimensional form and constitutes a sheet or thin film (for example of thickness—constant or variable—less than 2 µm) deposited on a substrate 22.

The body of the die 12 has a layered structure and comprises a first layer 16 of material having a resistivity less than 10 $\Omega$*m and which supports the surface region 14 which produces in negative form the pattern in relief to be impressed onto the polymeric material 10, and a second layer 24 of rigid material. The second layer 24 can be of dielectric material, for example silicon dioxide, glass, quartz, sapphire or ceramic or semi-conductor, for example silicon, or metal, for example nickel or chrome. Further examples of material of the second layer 24 are silicon nitride, silicon carbide, semi-conductive and photo-conductive mixtures.

In alternative embodiments of the invention, not illustrated, the second layer 24 may also have a layered structure and be constituted by two or more different substrates. In this case at least one of these substrates is of material having low electrical and thermal conductivity.

The various phases of the lithographic process are substantially similar to those described with reference to FIGS. 1A-1D, with the difference that in this case the pattern in relief is impressed onto a sheet or film rather than onto the surface of a three dimensional object. This latter can then be treated with an attack agent (for example by means of "reactive ion etching" or other technology based on the use of a plasma of reactive ions), so as to remove the polymeric material where it has been compressed and leave exposed the underlying substrate 22.

Figures from 3A to 3C illustrate the various phases of an alternative embodiment of the process of the invention, in which the same reference numerals as those previously utilised in FIGS. 2A-2D indicate equal or equivalent parts.

In this case, too, the body of the die 12 has a layered structure and includes a surface layer 16 of a material having a resistivity less than 1 $\Omega$*m, or preferably less than 0.0001 $\Omega$*m and which supports the surface region 14 which reproduces in negative form the pattern in relief to be impressed onto the polymeric material 10, and a second underlying layer 24.

The layered structures of the body of the die 12 can for example be a system of the silicon on insulation type (SOI), which involves the presence of a thin surface layer 16 of crystalline silicon, an intermediate layer of silicon oxide (not visible in drawings) and a base layer 24 of massive silicon. The surface layer 16 is massively doped so as to be made very conductive and to reproduce in negative form on its surface region 14 the pattern in relief to be impressed onto the polymeric material 10. This pattern can be formed in a conventional manner by means of lithographic techniques such as e-beam lithography and a process for subtractive attack known as "reactive ion etching" or "RIE". The surface layer 16 has electrodes 26 associated therewith so as to allow the introduction of an electric current which remains confined within it. The intermediate layer of silicon oxide in fact limits the flow of the current to the thin surface layer 16 and creates a barrier against propagation of heat towards the base layer 24.

Alternatively, the body of the die 12 may have a surface layer of strongly doped silicon 16 and a base layer 24 of intrinsic silicon. Such a structure can be formed by means of an ion implantation technique which makes it possible accurately to control the doping profile and the electrical conductivity of the silicon. The shaping of the surface profile 16 can be performed both before and after the ion implantation process. In this case, too, the presence of electrodes 26 on the surface layer 16 permits the flow of current substantially to this latter because of the very much lower conductivity of the underlying layer 24.

The various phases of the lithographic process are substantially similar to those described with reference to FIGS. 2A-2D. However, the use of a base layer of silicon as the region 16 of the die 12 in which dissipation of heat takes place offers the further advantage of being able to utilise the conventional methods of fabrication of the dies for NIL to shape its surface 14 intended to impress the polymeric material 10. This surface 14 can moreover be covered with release agents which promote its separation from the die 12 once the impression has been made.

Figure 4A:
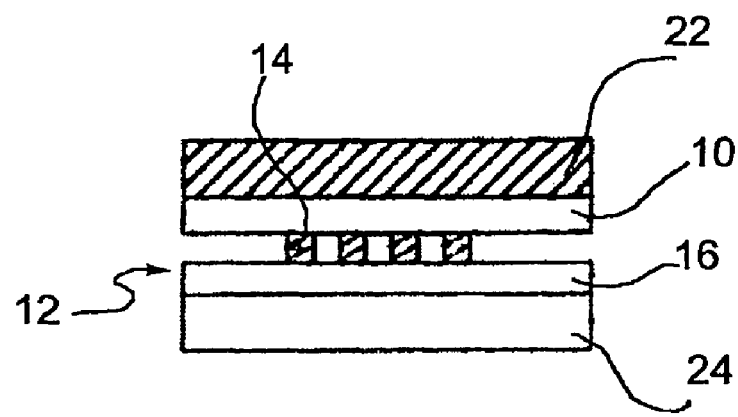
FIGS. 4A to 4C schematically represent successive phases of a fourth embodiment of the process of the invention.
Figure 4B:
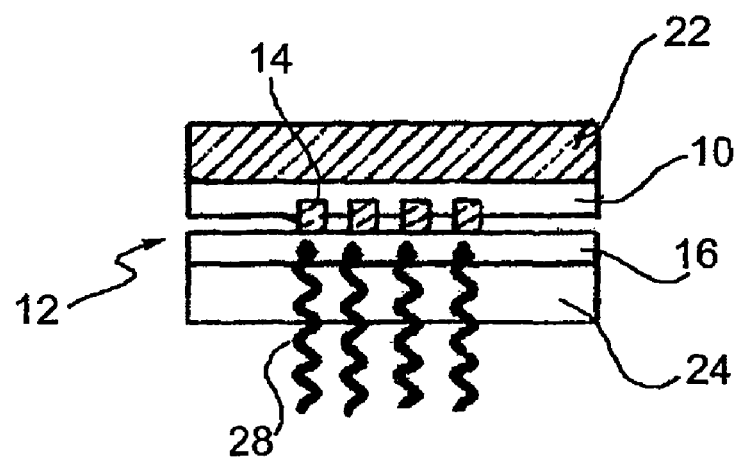
Figure 4C:
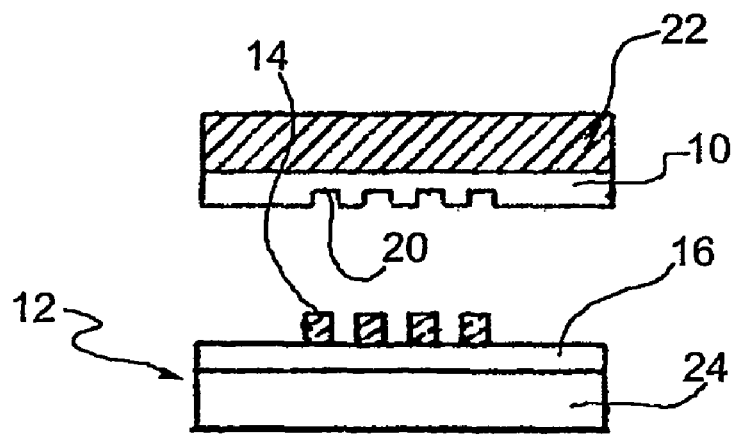

FIGS. 4A to 4C illustrate the various phases of an alternative embodiment of the process of the invention, in which the same reference numerals as those previously used indicate the same or equivalent parts.

In this case, too, the die 12 has a layered structure and includes a surface layer 16 of material capable of heating upon exposure to electromagnetic radiation, preferably to microwaves 28, and a base layer 24 of material which is substantially transparent to electromagnetic radiation. Examples of material of the base layer 24 are silicon oxide, glass, quartz, sapphire, ceramics, semiconductor materials, in particular silicon. The base layer 24 may, in turn, have a layered structure and may be formed by two or more sublayers.

The various phases of the lithographic process are substantially similar to those described with reference to FIGS. 2A-2D with the difference that the generation of heat in the region 16 is caused by its exposure to electromagnetic energy rather than by the passage of an electric current. This phenomenon is know as dielectric heating and is based on the principle of the rapid pre-polarisation of the molecules exposed to an electromagnetic field at high frequency.

There will now be described an exemplary embodiment of the process of the invention which, in the first place, envisages the use of a die provided with a heating element.

Figure 5A:
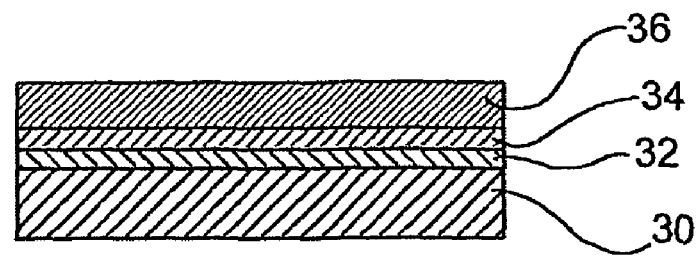
FIGS. 5A to 5E schematically represent successive phases in the production of a die for use in a process of the invention.
Figure 5B:
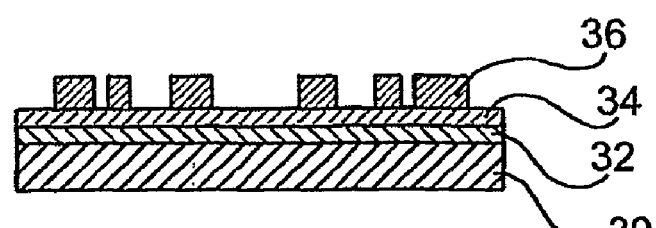
Figure 5C:
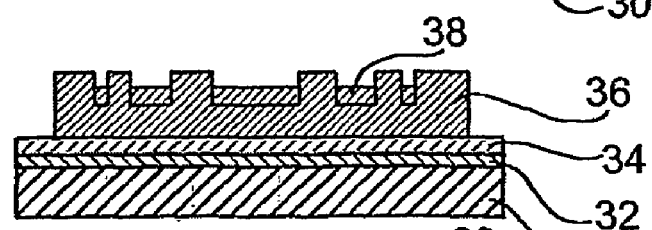
Figure 5D:
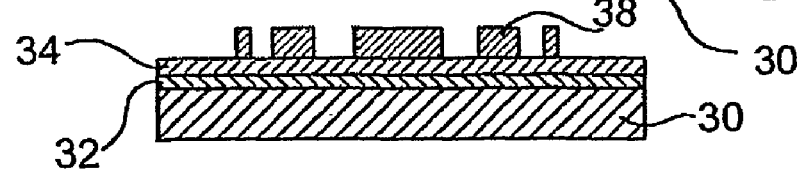
Figure 5E:
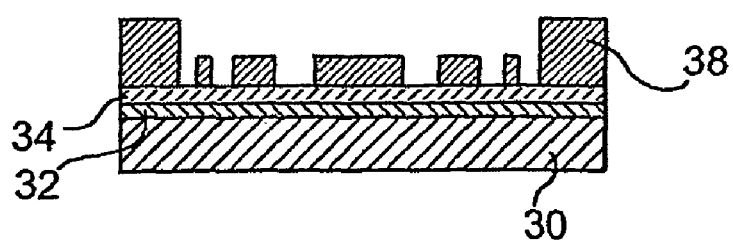

For this purpose a layered structure (FIG. 5A) is prepared having, in succession, a layer 30 of Si of thickness of 500 μm, a layer 32 of $SiO_2$ of thickness 5 μm, a double layer 34 of Cu/Au of thickness 20/10 nm and a layer 36 of photoresist having a thickness of 3 μm. This latter layer is subjected to optical lithography (FIG. 5B) for removal of the residue of the photoresist by means of $O_2$ plasma. Then an electrolytic deposition (electroplating) is effected with nickel 38 (FIG. 5C) and the residual photoresist is stripped (FIG. 5D). Finally, a contact shoe (FIG. 5E) of the layer 38 is formed with nickel having a thickness of 20 μm, which is welded with two external electric contacts not illustrated in the drawings. It is to be noted that the continuity of the nickel layer 38 is not interrupted and that it is apparently discontinuous in the drawing described above solely due to the fact that only a single section is illustrated therein.

In the die as formed the heating element is constituted by the layer 38 the profile of which will be reproduced in negative on a polymeric material, in particular of thermoplastic type.

As already previously described, the process of the invention allows the polymeric material to be subject to nano-impression to be heated without raising the overall temperature of the sample containing this material, nor that of the die. To slow down the propagation of heat to the layers underlying the layer 38 it is important that this latter be disposed above a material with low thermal conductivity, such as the silicon oxide of the layer 32, which has been produced by a thermal growth process. On the layer 32 there is then deposited by evaporation a double layer 34 of chrome and gold, serving as a base for the subsequent electrolytic deposition phase (electroplating of nickel). The layer 36 of photoresist is then deposited on the layer 34, for optical lithography.

The finished die covers a surface of $2 \times 2$ $cm^2$ and this surface is completely heatable by means of the passage of current.

The die was electrically connected to a pulsed supply system able to provide peaks of power greater than 1 MW.

This die was utilised to subject to nano-impression a sample formed by a substrate of silicon of dimensions $1 \times 1$ $cm^2$ covered by means of spin coating with a layer of 2 μm of thickness of polyethylmethacrylate (PEMA) which constitutes the thermoplastic material to be printed. Other polymers were also utilised such as polymethylmethacrylate (PMMA) and the commercial polymer Zeonex. The use of PEMA instead of PMMA was advantageous to reduce the printing temperatures.

The nano-impression process was performed by bringing the surface of the die and the thermoplastic material into contact and pressing one against the other by means of a press observing the following process parameters:

pressure: 8 MPa
duration of current pulses provided by the generator: 500 μs
voltage peak: 40 V
current peak: 170 A
repetition frequency: 50 Hz
duration of the process: 20 sec (~1000 pulses)

Figure 6B:
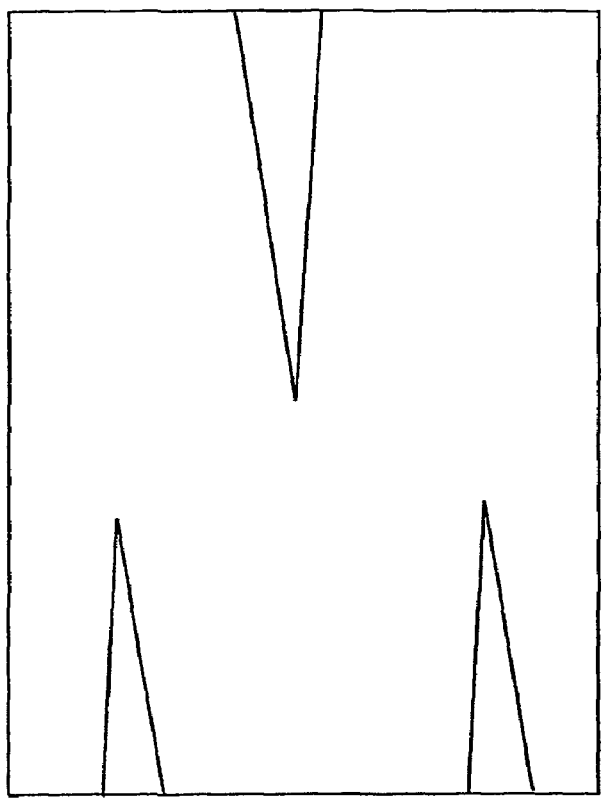
FIGS. 6A and 6B are micrographs of thermoplastic material showing the desired imprinting pattern after performance of the process of the invention.
Figure 6A:
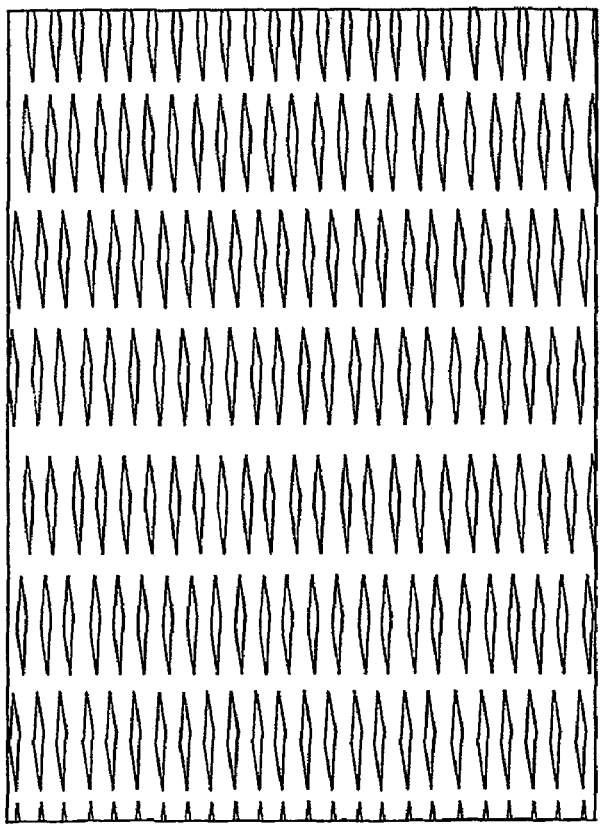

Micrographs of the thermoplastic material having, after the above described process, the desired imprinting pattern are shown in FIGS. 6A and 6B.

Naturally, the principle of the invention remaining the same, the details of performance and the embodiments can be widely varied with respect to what has been described purely by way of non-limitative example, without by this departing from the ambit of the invention. In particular, it is possible to effect a pre-heating of the die and/or to bring it into contact with the mass of polymeric material with a pressure of pulsed type. It is, moreover, possible to arrange that the heating phase includes a plurality of short successive cycles in such a way that the impression of the pattern is the result of a series of successive indentations of the die.

If necessary, it is further possible to effect a plurality of successive cycles of heating, contacting and separation, so as to print from time to time a certain pattern in relief on different portions of the mass of polymeric material. It is moreover possible locally to vary, in the limit even point by point, the quantity of thermal energy generated within the die, so as to adapt the characteristics of the process to specific requirements of use.

It is also possible to form the heating region of the die in the form of an extended capacitor comprising a sequence of metal-dielectric-metal layers. The dissipation of energy can be produced by resistive effects connected to the charging-discharging of such extended capacitor by the application of an alternating current (particularly in the frequency range 1 MHz-10 GHz) between the metal layers.

What is claimed is:

1. A micro-impression or nano-impression lithographic process for forming a pattern (20) in relief on a solid mass (10) of polymeric material for use in micro-devices and nano-devices, the process comprising the steps of:
    preparing said solid mass (10) of polymeric material and a die (12) having a surface region (14) facing towards said mass (10) of polymeric material and which reproduces in negative said pattern in relief (20),
    heating said surface region of said die (12) and putting said mass (10) of polymeric material into contact with the die (12) in an un-melted state in any temporal sequence in such a way that the parts of said mass (10) of the polymeric material in contact with said surface region (14) are subject to softening, and
    separating said die (12) from the mass (10) of polymeric material on the surface of which said pattern in relief (20) has been formed,
    wherein the heating of at least part of the die (12) is obtained by the generation of thermal energy upon dissipation of another form of energy in at least one region (16) of said die (12),
    wherein said surface region (16) of said die (12) in which thermal energy is generated remains for less than 25 seconds at a temperature greater than or equal to the glass transition temperature of the polymeric material and
    wherein said surface region (16) of the die (12) in which thermal energy is generated is in the form of a surface layer of the die.

2. A process according to claim 1, wherein said mass (10) of polymeric material has a three-dimensional form.

3. A process according to claim 1, wherein the region (16) in which energy is dissipated with consequent generation of heat is at a smaller distance than 100μm from the surface carrying the pattern in relief of said die (12).

4. A process according to claim 1, wherein said mass (10) of polymeric material has a two-dimensional form and is in the form of a sheet or thin film deposited on a substrate (22).

5. A process according to claim 1, wherein the region (16) of said die (12) in which thermal energy is generated remains for less than 50 milliseconds, at a temperature greater than or equal to the glass transition temperature of the polymeric material (10).

6. A process according to claim 1, wherein it includes a plurality of successive cycles of heating, contacting and separation.

7. A process according to claim 1, wherein the heating phase includes a plurality of short successive cycles in such a way that the impression of the pattern is the result of a series of successive indentations of the die (12).

8. A process according to claim 1, wherein the steps of heating the region (16) of the die (12) and contacting it with the mass (10) of polymeric material are synchronized.

9. A process according to claim 1, wherein said die (12) is put into contact under pressure with the mass (10) of polymeric material.

10. A process according to claim 9, wherein said pressure is exerted in a pulsed manner.

11. A process according to claim 9, wherein said pressure is obtained mechanically, or with electrostatic, magnetic, electromagnetic forces and/or with acoustic shock waves.

12. A process according to claim 1, wherein said die (12) is pre-heated to a desired temperature.

13. A process according to claim 1, wherein the quantity of thermal energy generated varies locally within said region (16) of the die (12).

14. A process according to claim 1, wherein said polymeric material (10) is of thermoplastic type.

15. A process according to claim 14, wherein said polymeric material (10) is chosen from the group consisting of polycarbonates, polymethylmethacrylates, polyethylene terephthalates, polyethylmethacrylates, polybutylene terephthalates, polyolefins and their mixtures.

16. A process according to claim 1, wherein at least one portion of the surface of the die (12) is clad with a release agent.

17. A process according to claim 1, wherein, after the pattern (20) in relief has been formed on the surface of the mass (10) of polymeric material, a treatment is performed with an attack agent so as to remove the polymeric material (10) where it has been compressed.

18. A process according to claim 1, wherein the surface region (14) of the die (12) which reproduces the pattern in relief in negative is aligned with pre-existing reference signs on the mass (10) of polymeric material or, if said material (10) is a thin film, on the substrate (22) on which said film is deposited.

19. A process according to claim 1, wherein said region (16) of the die (12) in which thermal energy is generated is of electrically conductive material.

20. A process according to claim 19, wherein the energy dissipated in heat is provided by an electric current (18) which flows in said electrically conductive material.

21. A process according to claim 20, wherein the direction of flow of said electric current (18) is substantially perpendicular to the direction of relative movement of the mass (10) of polymeric material and the die (12).

22. A process according to claim 1, wherein said region (16) of the die (12) in which thermal energy is generated coincides with said surface region (14) which reproduces said pattern in relief in negative.

23. A process according to claim 1, wherein said layer has a thickness less than 2 μm.

24. A process according to claim 1, wherein said layer has a non-uniform thickness in such a way that it is possible locally to vary the quantity of thermal energy generated.

25. A process according to claim 19, wherein said electrically conductive material is a metal.

26. A process according to claim 19, wherein said electrically conductive material is a semi-conductor.

27. A process according to claim 1, wherein said layer of electrically conductive material is obtained by doping a surface layer (16) of an intrinsically semiconductive or initially lightly-doped substrate, in such a way as to increase its conductivity with respect to the underlying portion (24) of the substrate.

28. A process according to claim 27, wherein said layer (16) to be doped is the outermost layer of silicon of a silicon-on-insulator (SOI) structure.

29. A process according to claim 27, wherein the doping operation is performed by ion implantation.

30. A process according to claim 20, wherein said electric current (18) is induced by applying a potential difference between at least two electrodes (26) connected to said electrically conductive material.

31. A process according to claim 20, wherein said electric current (18) is induced by a variable magnetic field.

32. A process according to claim 25, wherein said metal is chosen from the group consisting of Ti, Ni, Cr, Cu, Ag, Au, W, Ir, Ta, Pd, Mo, V and their alloys.

33. A process according to claim 26, wherein said semi-conductor is silicon.

* * * * *